United States Patent
Kawatsuji et al.

[11] Patent Number: 5,275,919
[45] Date of Patent: Jan. 4, 1994

[54] PROCESS FOR MAKING PHOTOSENSITIVE RESIN PRINTING PLATE AND PLATE-MAKING APPARATUS USED THEREFOR

[75] Inventors: Shinichi Kawatsuji; Masaru Yanagita, both of Fuji, Japan

[73] Assignee: Asahi Kasei Kogyo Kabushiki Kaisha, Osaka, Japan

[21] Appl. No.: 784,404

[22] PCT Filed: Apr. 24, 1991

[86] PCT No.: PCT/JP91/00544
§ 371 Date: Dec. 23, 1991
§ 102(e) Date: Dec. 23, 1991

[87] PCT Pub. No.: WO91/16668
PCT Pub. Date: Oct. 31, 1991

[30] Foreign Application Priority Data
Apr. 25, 1990 [JP] Japan ................ 2-109151

[51] Int. Cl.⁵ ............... G03F 7/38; G03B 27/04
[52] U.S. Cl. .................... 430/306; 430/300; 430/309; 430/327; 430/330; 355/85; 355/89; 355/99; 101/401.1

[58] Field of Search .............. 355/26, 85, 89, 99, 355/100; 430/306, 300, 330, 327, 309; 101/401.1

[56] References Cited

U.S. PATENT DOCUMENTS

| | | | |
|---|---|---|---|
| 3,597,080 | 8/1971 | Gush et al. | 355/85 |
| 3,635,711 | 1/1972 | Miller et al. | 430/309 |
| 4,600,667 | 7/1986 | Uchida | 430/306 |
| 4,927,723 | 5/1990 | Cusdin | 430/306 |

FOREIGN PATENT DOCUMENTS

| | | | |
|---|---|---|---|
| 0053708 | 6/1982 | European Pat. Off. | |
| 0267600 | 5/1988 | European Pat. Off. | |
| 2020415 | 12/1970 | Fed. Rep. of Germany | |
| 48-9009 | 3/1973 | Japan | |
| 54-34901 | 3/1979 | Japan | |
| 58-181046 | 10/1983 | Japan | |
| 61-232461 | 10/1986 | Japan | |
| 1-164939 | 6/1989 | Japan | 430/330 |

Primary Examiner—Marion E. McCamish
Assistant Examiner—Janis L. Dote
Attorney, Agent, or Firm—Birch, Stewart, Kolasch & Birch

[57] ABSTRACT

A photosensitive resin printing plate which can provide printed matter with good ink coverage and little dot gain, and a plate making apparatus used therefor.

3 Claims, 4 Drawing Sheets

PROCESS FOR MAKING PHOTOSENSITIVE RESIN PRINTING PLATE AND PLATE-MAKING APPARATUS USED THEREFOR

BACKGROUND OF THE INVENTION

1. Technical Field

The present invention relates to a process and apparatus for making photosensitive resin printing plates and, more particular, to a Process for making photosensitive resin printing plates which have a continuous and reliable high plate thickness and can produce printed matter with good ink coverage and little dot gain, such as photosensitive resin printing plates for relief printing, and as in corrugated board printing plate-making apparatus used therefor.

2. Discussion of Related Art

Plate making processes which use a liquid photosensitive resin to make relief plates for printing corrugated boards, newspapers and so forth are in increasingly wide use because, as compared with prior rubber printing plate making, they produce printing plates having excellent printing quality with less process steps.

The above-mentioned printing plate making which uses a liquid photosensitive resin is generally performed in the following manner. First, as shown in FIG. 4, a negative film 2 and a cover film 3 are placed one upon the other between two transparent substrates 1 and 1'. A liquid photosensitive resin layer 4 is formed thereon, and a base film 5 and a masking film 6 are laid thereon, one upon the other. Actinic light from light sources 7 and 7' is irradiated from both sides thereof to form images of relief parts and base parts. Next, the masking film 6 is removed, and back exposure is performed for fixing the relief parts formed on the base film 5. Numerals 8 and 8' indicate sponge dams for preventing the overflow of the liquid photosensitive resin.

Another method can also be used in which the masking film is not used and a back exposure for forming a relief base on the whole surface is performed from the base film side and then a relief exposure for forming the relief image is conducted from the negative film side.

Subsequently, in either case, developing is performed by washing out the uncured parts with a suitable washing agent and then post-exposure and drying treatments are applied, whereby the intended printing plate is obtained.

Such plate-making processes, however, incur the following disadvantages. As is apparent from the flow chart of the prior plate-making process shown in FIGS. 5A to 5D, when exposure is performed from the side of the upper transparent substrate 1', the upper substrate 1' undergoes deformation owing to the heat of polymerization generated by the photosensitive resin, whereas when exposure is performed from the side of the lower transparent substrate 1, the lower substrate 1 undergoes deformation in the same manner, so that the resulting printing plate has a large difference in thickness between the central part of the plate and the peripheral parts thereof, as shown in the sectional view of FIG. 6. When printing is performed by using such a printing plate, it is difficult to obtain clear printed images at the central part thereof because Poor ink coverage is experienced owing to the small plate thickness, while printed images with lower dot gain at the peripheral parts are obtained owing to the higher plate thickness.

SUMMARY OF THE INVENTION

The object of the present invention is to provide a process for making a relief printing plate which will overcome the above stated disadvantages capable of providing printed images which are clear, free from poor ink coverage, and show little dot gain. In other words, printed images having a higher image reproducibility relative to the originals are obtained by forming a relief printing plate having a constant image thickness in the height thereof between the central part and the peripheral parts of the relief image.

Extensive studies have been made on processes for making relief printing plates by using liquid photosensitive resins. As a result, it has been found that a printing plate with less difference in thickness between the central part and the peripheral part of the image can be made by using a specific apparatus as further described below and heating at least one of the transparent substrates of the configuration from the actinic source side, namely from the side opposite to the liquid photosensitive resin, before light exposure and/or during the exposure, to moderate the temperature gradient in the thickness direction of the transparent substrate and decrease the deformation of the substrate. The present invention has been accomplished on the basis of the above finding.

Thus, according to the present invention, there is provided a process for making a liquid photosensitive resin printing plate by placing an image-carrying film on at least one surface of a liquid photosensitive resin layer provided between two transparent substrates and performing image-forming exposure with actinic light from one side or both sides, followed by a developing treatment which is characterized by heating at least one of the upper and lower transparent substrates from the actinic light source side so as to moderate the deformation of the transparent substrate.

A plate-making apparatus for the photosensitive resin relief printing plates comprises two transparent substrates provided in upper and lower positions horizontally and in parallel with each other so as to produce a space for filling a liquid photosensitive resin therebetween and light sources respectively provided above the upper transparent substrate and below the lower transparent substrate for irradiating actinic light toward the respective transparent substrates which is characterized in that a heating means is (are) provided on the actinic light source side of at least one of the transparent substrates.

In the Figures, numerals 1 and 1' each indicate a transparent substrate, 2 a negative film, 3 a cover film, 4 a liquid photosensitive resin layer, 5 a base film, 6 a masking film, 7 and 7' each a light source, 8 and 8' each a sponge dam, 11 a supporting base, 12 and 12' each an electric heating wire, 13 a hot air blowing-in pipe, and 14 a hot air generator.

DETAILED DESCRIPTION OF

In the process of the present invention in which a liquid photosensitive resin is used as the raw material, the liquid photosensitive resin can be selected as desired from those usable in making photosensitive resin printing plates without any particular limitation imposed as to their kinds and compositions.

Figure 1A:
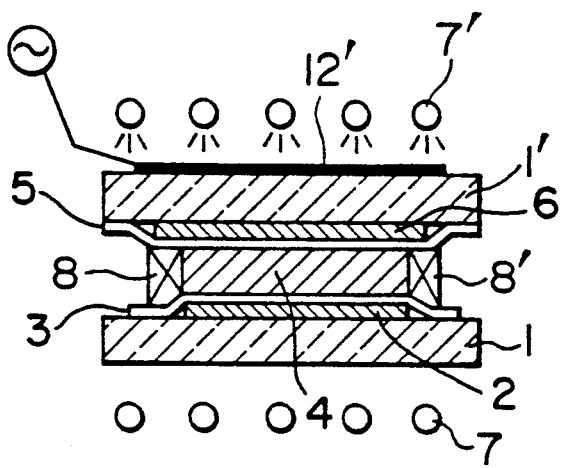
FIGS. 1A and 1B illustrate the process of the present invention.
Figure 1B:
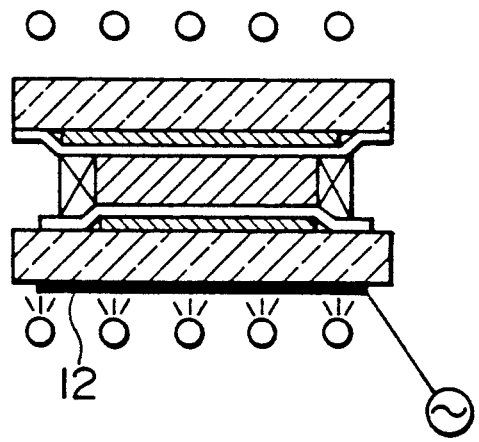

FIGS. 1A and 1B are sectional views for illustrating one example of the operational sequence of the process according to the present invention. A negative film 2 and a cover film 3 are placed one upon the other on a transparent substrate 1, e.g. a glass plate. A liquid Photosensitive resin 4 is cast thereon to form a photosensitive layer. A base film 5, e.g. a polyester film, is laminated further thereon, and a transparent substrate 1' is placed over the base film 5 with a masking film 6 being provided between the base film 5 and the substrate 1'. A sponge dam 8 and 8' for preventing the overflow of the liquid photosensitive resin is provided at the outer periphery of the configuration.

Next, a masking exposure is performed from the upper side, as seen in FIG. 1A. At this time, before and/or during the exposure, an electric current is applied to a heating wire 12' fixed to the upper surface of the upper transparent substrate 1' to heat the upper transparent substrate. Thereafter, relief exposure is performed from the lower side. Also, at this time, before and/or after the exposure, an electric current is applied to a heating wire 12 fixed to the lower surface of the lower transparent substrate 1 to heat the lower transparent substrate, as shown in FIG. 1B.

Figure 2:
FIG. 2 is a sectional view of a printing plate obtained by the process of the present invention.

Subsequently, the photosensitive layer thus exposed is washed with a washing liquid in a conventional manner, and subjected to developing, then postexposure and drying to obtain an improved printing plate having a printing image with less difference of height between the central part and the peripheral parts thereof, as shown in the sectional view of FIG. 2.

Figure 3A:
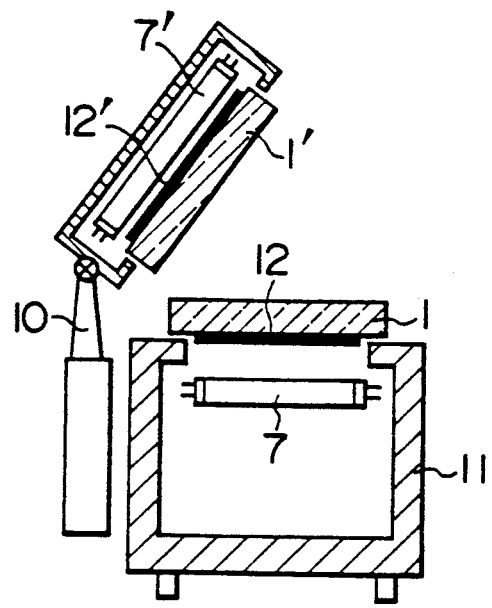
FIGS. 3A and 3C are each a sectional view of the principal part of one example of the apparatus according to the present invention.

One example of the plate-making apparatus of the present invention used for the plate-making process will be described. FIG. 3A is a sectional view of one example of such a plate-making apparatus. The apparatus is composed of an upper light source box containing an upper transparent substrate 1' opened and closed as desired through a support arm 10, a lower transparent substrate 1 placed upon the upper opening of a box-shaped support base 11 whose upper part is open, and active light sources 7' and 7 respectively provided above the upper transparent substrate and below the lower transparent substrate. On the light source sides of the lower transparent substrate 1 and the upper transparent substrate 1' there are fixed electric heating wires 12 and 12' respectively as a means for heating the transparent substrates.

Figure 3C:
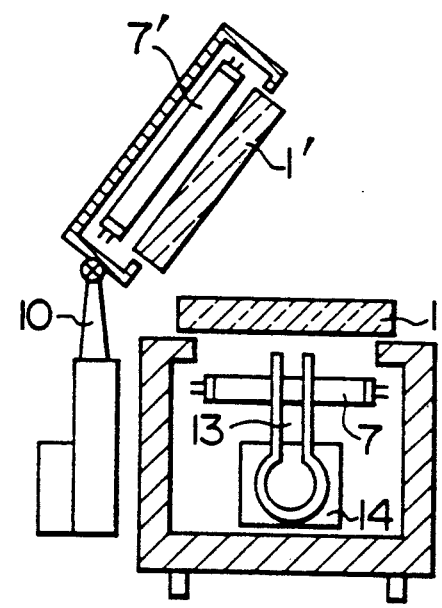
Figure 3B:
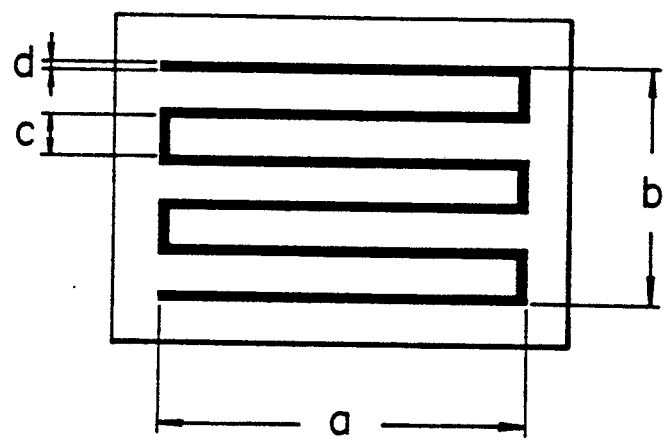
FIG. 3B is a diagram showing one example of the pattern of electric heating applied to the transparent substrate.
Figure 4:
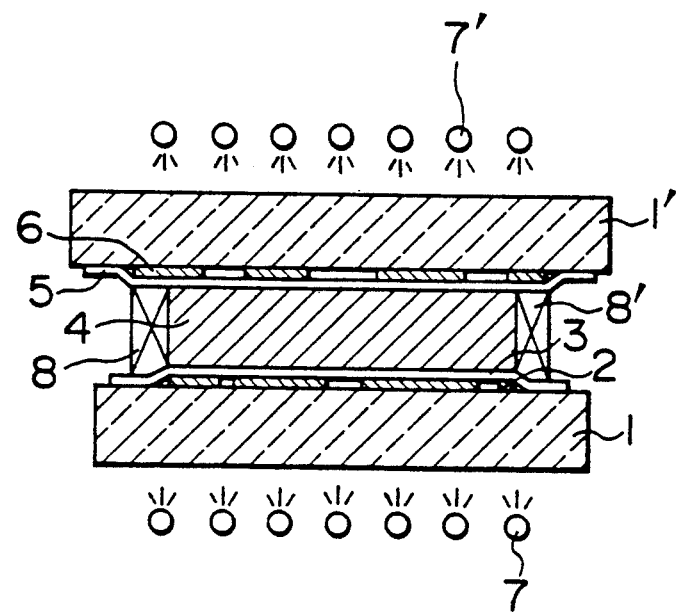
FIG. 4 is a sectional view illustrating the general procedure for making a liquid photosensitive resin printing plate, FIGS. 5A to 5D provide a step-wise representation of the prior art method.
Figure 6:
FIG. 6 is a sectional view of a printing plate obtained by the prior art method.
Figure 5A:
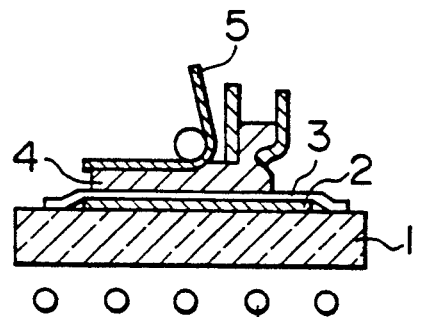
Figure 5B:
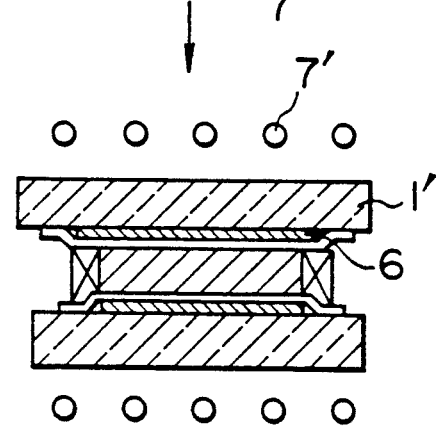
Figure 5C:
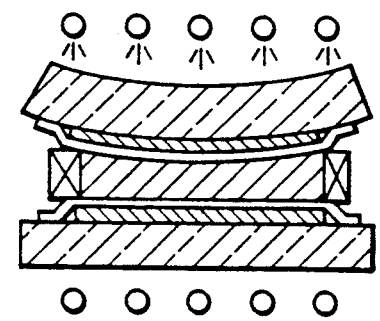
Figure 5D:
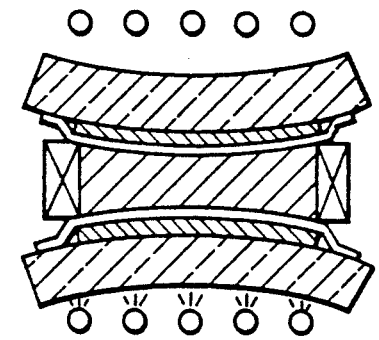

FIG. 3C illustrates one example of a pattern of electric heating wire fixed to the upper or lower transparent substrate. Usually the fixing dimensions a and b, as shown in FIG. 3B, are desirably selected so as to be approximately the same as the casting dimension of the liquid photosensitive resin. It is, needless to say, that the fixing pitch c of the heating wire should be selected such that the whole heated surface becomes substantially uniform in temperature, in consideration of the material, thickness, thermal conductivity and other factors of the transparent substrates. The fixing width d of the heating wire is determined taking into consideration the light source characteristics, the material and thickness of the transparent substrates, and image-reproducing property required. When the light source is an ultraviolet fluorescent lamp and the transparent substrate is made of inorganic glass of 12 mm or more in thickness, the dimension of d is usually 5 mm or less and, to obtain a higher image reproducibility, desirably 3 mm or less.

As to the shape of the electric heating wire, though ordinary wires having a circular section may be used, those having a rectangular section are preferred from the point of heat transfer characteristic and adhesion to the transparent substrate. The heating wire is fixed to the transparent substrate desirably by use of those means of adhesion which can provide good and heat resistant adhesion to the substrate. As such means of adhesion, usually silicone-base adhesives or sealants, epoxy-base adhesives, and the like may be used.

The transparent substrate can be heated by means other than electric heating wires. For example, surface heating elements may be fixed to the light source side surfaces of the respective substrates, or electroconductive films may be formed on the surfaces and an electric current applied thereto. Further, the heating may be effected by blowing hot air against the respective surfaces or by means of an infrared heater.

Though photosensitive resin printing platemaking apparatuses may vary in the dimension of the plates which can be made, the process of the present invention is effective for apparatuses which provide relatively large plate dimensions. In the cases where inorganic glass is used as the transparent substrate, the process is particularly effectively applied to apparatuses which produce printing plates having dimensions of about 400 mm by 600 mm or larger and is not restricted by the thickness of the transparent substrate.

According to the present invention, the following effects can be obtained:

(1) A difference in thickness between the central part and the peripheral parts of a printing plate may be reduced and a printing plate having a consistent plate thickness obtained. As a result, printed matter of good quality with good ink coverage and little dot gain can be obtained by using the printing plate, (2) The abnormality of the shoulder shape of the photosensitive resin, a phenomenon called flow, resulting from the running of the resin during exposure caused by the deformation of the substrate during the exposure can be prevented, and (3) Since the printing plate obtained by the process of the present invention makes printing under uniform printing pressure possible, it can prevent the lowering of printability due to excessively high local printing pressure and lowers the separability caused by paper dust which may enter the printing plate during printing.

PREFERRED EMBODIMENTS

The present invention will be described further in detail below with reference to the Examples.

EXAMPLE 1

A liquid photosensitive resin (APR F-46, a registered trade name, mfd. by Asahi Chemical Industry Co., Ltd.) was cast on a hard substrate made of soda glass polished in high precision via a negative film and a cover film, to form a photosensitive layer 7 mm in thickness. A hard substrate made of soda glass polished in high precision was placed thereon via a polyester base film and a masking film. The spacing between the two hard substrates was maintained by means of a spacer. Then, image-forming exposure was conducted by irradiating ultraviolet lamps from the both sides of the photosensitive layer while close contact of the negative film and the masking film was maintained by application of suction under vacuum. During said exposure from the upper and lower sides, electric currents were applied to heating wires fixed to the upper surface of the upper hard substrate and to the lower surface of the lower hard substrate to heat respective substrates, the electric currents being controlled such that the deformation of the upper and lower hard substrates to the photosensitive layer side was limited to 40 μm or less.

The electric heating wire used for heating the transparent substrates was a flat nichrome wire having a thickness of 0.1 mm, width of about 1.2 mm and resistance of 10 Ω/cm, which was sticked with a silicone-base adhesive at a pitch of 50 mm.

The photosensitive layer thus exposed was washed out with a washing liquid according to a conventional method and subjected to developing, then post-exposure and drying to obtain a printing plate having a plate thickness of 7 mm.

The maximum deformation of the glass substrate at the time of exposure, plate thickness according and difference in thickness of plate are shown in the Table. The "difference in thickness of plate" was determined from the difference between the thickness of central part of the plate and the thickness of peripheral part of the plate.

COMPARATIVE EXAMPLE

A printing plate 7 mm in plate thickness was obtained in exactly the same manner as in Example 1 except that the hard substrates were not heated with heating wires at the time of exposure. The results thus obtained are shown in the Table.

TABLE

| | Max. deformation in exposure (μm) | | Plate thickness | |
|---|---|---|---|---|
| | Upper glass plate | Lower glass plate | Thickness accuracy (mm) | Difference of thickness (mm) |
| Example 1 | 40 | 40 | 8/100 | 1/100 |
| Comparative Example | 120 | 180 | 22/100 | 12/100 |

EXAMPLE 2

The photosensitive resin used was APR F-47 (a registered trade name, mfd. by Asahi Chemical Industry Co., Ltd.). Ultraviolet lamps were irradiated from the both sides of the photosensitive layer in the same manner as in Example 1 to effect image-forming exposure.

At this time, during the masking exposure from the upper side, hot air at 60° C. was blown at a rate of 12 m³/min against the upper base of the upper hard substrate; on the other hand, during the relief exposure from the lower side, hot air at 60° C. was blown at a rate of 15 m³/min against the lower face of the lower hard substrate.

The photosensitive layer was then subjected to developing, post-exposure and drying in the same manner as in Example 1 to obtain a printing plate having a plate thickness of 5 mm.

The printing plate showed a plate thickness accuracy of 7/100 mm and a difference of height of 1/100 mm. Printing on A-flute corrugated boards at a rate of 80 sheet/min with a corrugated board printer using the printing plate obtained above gave printed boards with no poor ink coverage and little of dot gain.

According to the process for making the photosensitive resin printing plates of the present invention, printing plates of high plate thickness accuracy can be obtained and hence printed matter with good ink coverage and little dot gain can be obtained. Further, according to the photosensitive resin printing plate-making apparatus of the present invention, the Phenomenon of flow caused by the moving of the photosensitive resin during exposure can be prevented. Further, since the photosensitive resin printing plate obtained by using the present apparatus makes printing under uniform printing pressure possible, it can prevent the lowering of printability due to excessively high local printing pressure and the lowering of separability caused by paper dust which may enter the printing plate during printing.

Accordingly, it is evident that the industrial applicability of the present invention is very high.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for making a liquid photosensitive resin printing plate which comprises providing a liquid photosensitive resin layer between upper and lower transparent substrates, placing an image-carrying film on at least one surface of said photosensitive resin layer, selectively exposing said liquid photosensitive resin layer with actinic light from an actinic light source from at least one side of said upper and lower transparent substrates to form an image on said liquid photosensitive resin layer, while heating said exposed at least one of said upper and lower transparent substrates with an electric heating wire fixed on at least one of said substrates by supplying electric current to said electric heating wire before and/or during said exposure to said actinic light source, and subjecting said exposed liquid photosensitive resin layer to a developing treatment to form a photosensitive resin printing plate.

2. An apparatus for making a photosensitive resin printing plate which comprises in combination: two transparent substrates horizontally positioned in upper and lower positions parallel with each other so as to provide a space therebetween for filling with a liquid photosensitive resin, providing at least one light source on at least one side of said upper and lower transparent substrates for irradiating actinic light toward at least one of said transparent substrates, and at least one electric heating wire fixed on at least one of said transparent substrates.

3. An apparatus according to claim 2, wherein said at least one light source is an ultraviolet fluorescent lamp, and said transparent substrates are inorganic glass plates of 12 mm or more in thickness, said electric heating wire having a fixing width of 5 mm or less.

* * * * *